COMPLEMENTARY SYMMETRY TRANSISTOR AMPLIFIER HAVING A CONSTANT COMMON CONNECTION OPERATING POTENTIAL
Filed Feb. 11, 1963
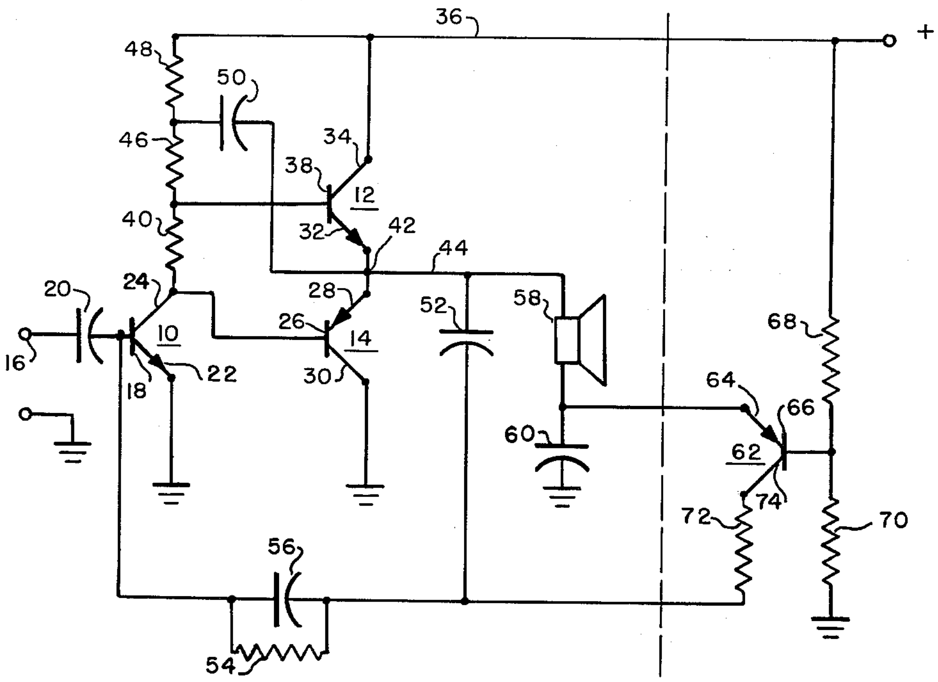
INVENTOR,
HARRY W. PARMER.
BY Julian C. Keppler
ATTORNEY.

3,188,574
Patented June 8, 1965

3,188,574

COMPLEMENTARY SYMMETRY TRANSISTOR AMPLIFIER HAVING A CONSTANT COMMON CONNECTION OPERATING POTENTIAL

Harry W. Parmer, 239 Pinewood Ave., Oakhurst, N.J.

Filed Feb. 11, 1963, Ser. No. 257,801
2 Claims. (Cl. 330—13)
(Granted under Title 35, U.S. Code (1952), sec. 266)

The invention described herein may be manufactured and used by or for the Government for governmental purposes without the payment of any royalty thereon.

This invention relates to direct coupled transistor amplifiers, and more particularly to a feedback circuit for stabilizing the operating point of the output stage of such amplifiers.

Transistor characteristics are generally temperature dependent, particularly in that the collector current tends to increase with temperature. Stable operation of direct coupled transistor amplifiers therefore requires the use of special circuits to keep the operating point at a predetermined value, thereby to yield low distortion operation at high power levels under a wide variety of ambient temperature.

Heretofore, direct coupled amplifiers utilizing complementary symmetry connections have been successfully used for units with outputs in the milliwatt range. However, when these amplifiers are required to provide several watts output, their operation has become unstable and unreliable due to the tendency of the output stage to go into thermal runaway. Thermal runaway is caused by changes in the transistor characteristics resulting from the heating generated during normal operation. Various methods have been tried in an attempt to compensate for these undesirable changes. One method to reduce the tendency for thermal runaway utilizes a resistor connected between the emitter electrode of the driver stage and ground. However, a resistance in series with the emitter, has the disadvantage of reducing the output power and is likely to introduce distortion, particularly at high power levels.

It is an object of this invention to provide a biasing means for a direct coupled transistor amplifier that will automatically compensate for the normal variations in transistor characteristics, and for the changes incurred due to variations in ambient temperature.

According to the invention, in a transistor amplifier having a driver stage directly coupled to an output stage which includes two transistors in complementary symmetry with their respective emitters connected in common, the amplifier is further improved by maintaining said common connection at a prescribed operating potential, when the amplifier is dynamically operated. The improvement includes feedback means comprising a control transistor having a fixed emitter-base bias and having its emitter in circuit with said common connection. There is also provided a feedback resistor connected in series between the collector of the control transistor and the input of the driver stage. With this arrangement, the input of the driver stage is responsive to the output current of the control transistor such that said common connection is maintained at the prescribed operating potential.

For a more detailed description of the invention, together with other and further objects thereof reference is had to the accompanying drawing, wherein the single figure is a schematic diagram of an audio amplifier including an illustrative embodiment of the biasing arrangement of the present invention.

Referring to the drawing, the elements to the left of the dotted line shows a basic direct coupled audio amplifier circuit which includes transistor 10 in the driver stage, and output stage transistors 12 and 14 connected in a complementary symmetry push-pull relation. As shown, transistors 10 and 12 are of the NPN junction type and transistor 14 is of the PNP junction type. Each of these transistors has the usual electrodes designated as an emitter, a collector and a base.

The input signal is applied from terminal 16 to the base 18 of transistor 10 through coupling capacitor 20. The emitter 22 of transistor 10 is shown connected to ground. The collector 24 of transistor 10 is directly connected to the base 26 of transistor 14 which has an emitter 28, and a collector 30. Collector 30 is connected to ground. Transistor 12 has an emitter 32, a collector 34 directly connected to voltage supply lead 36, and a base 38 connected to base 26 of transistor 14 through resistor 40. The emitters 28 and 32 are connected together in common at point 42 on output lead 44.

Resistor 46, which is the collector load resistor for transistor 10, is connected between base 38 of transistor 12 through resistor 48 to voltage supply lead 36. Feedback capacitor 50 is connected between common connection point 42 of transistors 12 and 14 to the junction of resistors 46 and 48 to apply an A.C. feedback across resistor 48. Feedback capacitor 52 is connected between junction point 42 and base 18 of transistor 10 through the parallel arrangement of resistor 54 and bypass capacitor 56. The output from this basic direct coupled audio amplifier is taken across a utilization device such as a dynamic speaker 58, having a voice coil not shown, connected in series to ground between point 42 on output lead 44 and bypass capacitor 60.

A serious problem encountered with the basic amplifier described above is the variation, due to ambient temperature changes, in the steady state voltage at output point 42, which is the common junction of the emitters 32 and 28 of the output transistors 12 and 14, respectively. In order that the amplifier maintain a steady state voltage at point 42, and thus provide a high output over a wide range of ambient temperature changes, a bias voltage supply circuit for the driver transistor 10, in accordance with the invention, is combined with the above basic amplifier.

The bias circuit, shown to the right of the dotted line in the figure, includes a PNP control transistor 62 having an emitter 64 connected in series with the dynamic speaker 58 to the common connection point of emitters 32 and 28. The base 66 of transistor 62 is supplied with bias voltage through a voltage divider comprising resistors 68 and 70 connected betwen the voltage supply lead 36 and ground, respectively, and having the junction of said resistors connected to the base. Collector load feedback resistor 72 is connected in series with the collector electrode 74 of transistor 62, through the parallel arrangement of resistor 54 and capacitor 56 to base 18 of transistor 10. The values of resistor 54 and capacitors 52 and 56 are selected to provide the desired A.C. feedback independent of the D.C. bias control.

At steady state operation, voltage divider resistors 68 and 70 are chosen to provide the proper bias to base 18 of transistor 10 through the collector circuit of transistor 62. Any variation in ambient temperature, which will cause the steady state D.C. voltage at point 42 to vary, will be sensed by the base-emitter bias on transistor 62. This change is bias will result in a change in the base current of transistor 10, through the negative feedback loop established from the collector 74 of transistor 62 to base 18 of transistor 10. Since the complementary symmetry arranged transistors 12 and 14 are directly coupled to the collector circut of transistor 10, the resultant change in collector current of transistor 10 will change the bias on transistors 12 and 14. This change is bias on transistors 12 and 14 will result in point 42 returning to its steady state voltage value, and in turn return the bias on transistor 62 to a value necessary to provide desired operation of the amplifier circuit. In other words, point 42 is held at a well regulated voltage through the use of a control transistor having a constant potential on its base.

It will be evident, that by provision of the present invention, a highly stable direct coupled amplifier which has extremely small distortion has been described.

While there has been described what is at present considered to be the preferred embodiment of the invention, it will be obvious to those skilled in the art that various changes and modifications may be made therein without departing from the invention, and it is therefore aimed in the appended claims to cover all such changes and modifications as fall within the true spirit and scope of the invention.

What is claimed is:

1. In a transistor amplifier having a common-emitter driver stage directly coupled to an output stage which includes two transistors connected in complementary symmetry with respective emitters connected in common, said common connection being at a prescribed operating potential, feedback means connected between said output stage and said driver stage for maintaining said operating potential constant when the amplifier is dynamically operated, said feedback means comprising a control transistor having an emitter, collector and base, a voltage divider network connected across a fixed unidirectional voltage source, said control transistor having its base connected to said voltage divider for maintaining a fixed emitter-base bias and having its emitter coupled to said common connection, the collector of said control transistor being coupled to the input of said driver stage, the current in the collector circuit of said control transistor being representative of said operating potential of said common connection, said driver stage being responsive to changes in the collector current of said control transistor for maintaining said common connection at the prescribed operating potential.

2. In a transistor amplifier, feedback means as defined in claim 1 wherein said collector of said control transistor is connected to the input of said driver stage through a resistor.

References Cited by the Examiner

UNITED STATES PATENTS

| | | | |
|---|---|---|---|
| 2,761,917 | 9/56 | Aronson | 330—15 |
| 2,860,195 | 11/58 | Stanley | 330—17 X |

ROY LAKE, *Primary Examiner.*

NATHAN KAUFMAN, *Examiner.*